United States Patent
Jan et al.

(10) Patent No.: US 12,167,699 B2
(45) Date of Patent: *Dec. 10, 2024

(54) MAGNETIC LAYER FOR MAGNETIC RANDOM ACCESS MEMORY (MRAM) BY MOMENT ENHANCEMENT

(71) Applicant: Taiwan Semiconductor Manufacturing Company, Ltd., Hsinchu (TW)

(72) Inventors: Guenole Jan, San Jose, CA (US); Jodi Mari Iwata, San Carlos, CA (US); Ru-Ying Tong, Los Gatos, CA (US); Huanlong Liu, Sunnyvale, CA (US); Yuan-Jen Lee, Fremont, CA (US); Jian Zhu, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 785 days.

This patent is subject to a terminal disclaimer.

(21) Appl. No.: 17/208,303

(22) Filed: Mar. 22, 2021

(65) Prior Publication Data
US 2021/0210680 A1    Jul. 8, 2021

Related U.S. Application Data

(63) Continuation of application No. 16/728,455, filed on Dec. 27, 2019, now Pat. No. 10,957,851, which is a
(Continued)

(51) Int. Cl.
*H10N 50/01* (2023.01)
*G11C 11/16* (2006.01)
(Continued)

(52) U.S. Cl.
CPC ........... *H10N 50/01* (2023.02); *G11C 11/161* (2013.01); *H01F 10/3286* (2013.01);
(Continued)

(58) Field of Classification Search
CPC ....... H10N 50/00–01; H10N 50/10–85; H10B 61/00; H10B 61/10; G11C 2211/5615; G11C 2211/161
See application file for complete search history.

(56) References Cited

U.S. PATENT DOCUMENTS 6,205,052 B1    3/2001  Slaughter et al.
6,452,204 B1    9/2002  Ishiwata et al.
(Continued)

FOREIGN PATENT DOCUMENTS

JP    2008124486    5/2008
JP    2011138954    7/2011
(Continued)

OTHER PUBLICATIONS

Zhu, Jian-Gang, et al., "Microwave Assisted Magnetic Recording", IEEE Transactions on Magnetics, vol. 44, No. 1, Jan. 2008, pp. 125-131.
(Continued)

*Primary Examiner* — Jose R Diaz
(74) *Attorney, Agent, or Firm* — HAYNES AND BOONE, LLP

(57) ABSTRACT

A perpendicularly magnetized magnetic tunnel junction (p-MTJ) is disclosed wherein a boron containing free layer (FL) is subjected to a plasma treatment with inert gas, and a natural oxidation (NOX) process to form $B_2O_3$ before overlying layers are deposited. A metal layer such as Mg is deposited on the FL as a first step in forming a Hk enhancing layer that increases FL perpendicular magnetic anisotropy, or as a first step in forming a tunnel barrier layer on the FL.
(Continued)

One or more anneal steps are essential in assisting $B_2O_3$ segregation from the free layer and thereby increasing the FL magnetic moment. A post-oxidation plasma treatment may also be used to partially remove $B_2O_3$ proximate to the FL top surface before the metal layer is deposited. Both plasma treatments use low power (<50 Watts) to remove a maximum of 2 Angstroms FL thickness.

20 Claims, 7 Drawing Sheets

Related U.S. Application Data continuation of application No. 16/109,063, filed on Aug. 22, 2018, now Pat. No. 10,522,752.

(51) Int. Cl.
| | | |
|---|---|---|
| H01F 10/32 | (2006.01) | |
| H10B 61/00 | (2023.01) | |
| H10N 50/10 | (2023.01) | |
| H10N 50/80 | (2023.01) | |
| H10N 50/85 | (2023.01) | |

(52) U.S. Cl.
CPC ............ *H10B 61/00* (2023.02); *H10B 61/10* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 6,544,801 | B1 | 4/2003 | Slaughter et al. |
| 6,649,960 | B1 | 11/2003 | Cross |
| 6,760,250 | B2 | 7/2004 | Kajiyama |
| 7,009,266 | B2 | 3/2006 | Shi et al. |
| 7,009,877 | B1 | 3/2006 | Huai et al. |
| 7,211,446 | B2 | 5/2007 | Gaidis et al. |
| 7,276,384 | B2 | 10/2007 | Parkin et al. |
| 7,595,520 | B2 | 9/2009 | Horng et al. |
| 7,598,579 | B2 | 10/2009 | Horng et al. |
| 7,839,605 | B2 | 11/2010 | Parker |
| 8,372,661 | B2 | 2/2013 | Horng et al. |
| 8,455,965 | B2 | 6/2013 | Li et al. |
| 8,482,966 | B2 | 7/2013 | Kang et al. |
| 8,498,150 | B2 | 7/2013 | Ranjan et al. |
| 8,541,855 | B2 | 9/2013 | Jan et al. |
| 8,673,654 | B2 | 3/2014 | Hong et al. |
| 8,796,795 | B2 | 8/2014 | Satoh et al. |
| 8,796,814 | B2 | 8/2014 | Ogihara |
| 8,852,762 | B2 | 10/2014 | Abraham et al. |
| 8,871,365 | B2 | 10/2014 | Wang et al. |
| 8,946,834 | B2 | 2/2015 | Wang et al. |
| 9,006,704 | B2 | 4/2015 | Jan et al. |
| 9,048,411 | B2 | 6/2015 | Jan et al. |
| 9,123,887 | B2 | 9/2015 | Lai et al. |
| 9,166,151 | B2 | 10/2015 | Murayama et al. |
| 9,177,574 | B2 | 11/2015 | Fuji et al. |
| 9,230,571 | B1 | 1/2016 | Chen et al. |
| 9,281,168 | B2 | 3/2016 | Mudivarthi et al. |
| 9,425,387 | B1 | 8/2016 | Liu et al. |
| 9,472,752 | B2 | 10/2016 | Wang et al. |
| 9,780,299 | B2 | 10/2017 | Zhu et al. |
| 9,905,753 | B2 | 2/2018 | Lee et al. |
| 10,522,752 | B1 | 12/2019 | Jan et al. |
| 10,957,851 | B2 * | 3/2021 | Jan .................. H01F 10/3286 |
| 2004/0087163 | A1 | 5/2004 | Steimle et al. |
| 2005/0164414 | A1 | 7/2005 | Deak |
| 2005/0184838 | A1 | 8/2005 | Nguyen et al. |
| 2006/0198063 | A1 | 9/2006 | Fukuzawa et al. |
| 2006/0209473 | A1 | 9/2006 | Oshima et al. |
| 2007/0183187 | A1 | 8/2007 | Guo |
| 2007/0243639 | A1 | 10/2007 | Pietambaram et al. |
| 2009/0021869 | A1 | 1/2009 | Kamiguchi et al. |
| 2009/0257151 | A1 | 10/2009 | Zhang et al. |
| 2010/0109110 | A1 | 5/2010 | Wang et al. |
| 2010/0148167 | A1 | 6/2010 | Whig et al. |
| 2011/0293967 | A1 | 12/2011 | Zhang et al. |
| 2012/0299134 | A1 | 11/2012 | Jan et al. |
| 2013/0264665 | A1 | 10/2013 | Jan et al. |
| 2014/0349415 | A1 | 11/2014 | Oguz et al. |
| 2015/0008547 | A1 | 1/2015 | Pi et al. |
| 2016/0163971 | A1 | 6/2016 | Jeong |
| 2017/0018706 | A1 | 1/2017 | Xue et al. |
| 2017/0194561 | A1 | 7/2017 | Suyama et al. |
| 2017/0263861 | A1 | 9/2017 | Park et al. |
| 2018/0076261 | A1 | 3/2018 | Yoshikawa et al. |
| 2018/0269385 | A1 | 9/2018 | Iwata et al. |
| 2018/0301621 | A1 | 10/2018 | Sato et al. |
| 2019/0122799 | A1 | 4/2019 | Shum et al. |
| 2019/0140165 | A1 | 5/2019 | Hu et al. |
| 2019/0140166 | A1 | 5/2019 | Rahman et al. |
| 2020/0144494 | A1 | 5/2020 | Jan et al. |

FOREIGN PATENT DOCUMENTS

| | | |
|---|---|---|
| JP | 2011166060 | 8/2011 |
| WO | WO 2017131584 | 8/2017 |

OTHER PUBLICATIONS

Hosomi et al., "A Novel Nonvolatile Memory with Spin Torque Transfer Magnetization Switching: Spin-Ram", IEEE International Electron Devices Meeting, 2005, Dec. 5, 2005, IEDM paper 19-1, 4 pages.

Hayakawa, Jun, et al., "Current-Driven Magnetization Switching in CoFeB/MgO/CoFeB Magnetic Tunnel Junctions", Japanese Journal of Applied Physics, vol. 44, No. 41, 2005, Sep. 30, 2005, pp. L 1267-L 1270.

Oogane, Mikihiko, et al., "Magnetic Damping in Ferromagnetic Thin Films", Japanese Journal of Applied Physics, vol. 45, No. 5A, 2006, May 9, 2006, pp. 3889-3891.

Huai, Yiming, et al., "Spin transfer switching current reduction in magnetic tunnel junction based dual spin filter structures", Applied Physics Letters 87, 222510, Nov. 2005, pp. 1-3.

Slonczweski, J.C., "Current-driven excitation of magnetic multilayers", Journal of Magnetism and Magnetic Materials, vol. 159, Issues 1-2, Jun. 1996, pp. L1-L7, Elsevier.

PCT Search Report, Application No. PCT/US201 6/058449, Applicant: Headway Technologies, Inc., Mail date: Feb. 6, 2017, 15 pgs.

Luo, Yu-Ran, "Bond Dissociation Energies", Journal of Chemical Theory and Computation, Feb. 23, 2010, pp. 9-65 to 9-98, XP055336421, Chapter 1, Retrieved from the Internet: URL:http://staff.usto.edu.cn/luo971/2010-91_-CRC-BOEs-Tables.pdf.

Mangin, S., et al., "Current-induced magnetization reversal in nanopillars with perpendicular anisotropy", 2006 Nature Publishing Group, q nature materials, vol. 5, Mar. 2006, www.nature.com/naturematerials, pp. 210-215.

European Search Report, Application No. 13754577.8-1556 / 2820681 PCT/US201 3022877, Applicant: Headway Technologies, Inc., et al., Mail date: Jan. 20, 2016, 10 pgs.

PCT Search Report, International application No. PCT/US 08/11314, Applicant: Magic Technologies, Inc., Mail date: Dec. 5, 2008, 10 pgs.

Bilzer, C. et al., "Study of the dynamic magnetic properties of soft CoFeB films", Journal of Applied Physics 100, 053903 (2006), American Institute of Physics, pp. 1-4.

Djayaprawira, David D. et al., "230% room-temperature magnetoresistance in CoFeB/MgO/CoFeB magnetic tunnel junctions", Applied Physics Letters 86, 092502 (2005), American Institute of Physics, pp. 1-3.

Almasi, H. et al., "Enhanced tunneling magnetoresistance and perpendicular magnetic anisotropy in Mo/CoFeB/MgO magnetic tunnel junctions", Applied Physics Letters 106, 182406, May 2015, pp. 1-4.

Watanabe, Kyota et al., "Magnetic Properties of CoFeB—MgO Stacks with Different Buffer Layer Materials (Ta or Mo)", IEEE Transactions on Magnetics (vol. 52, Issue: 7, Jul. 2016), pp. 1-4.

(56) References Cited

OTHER PUBLICATIONS

Li, Xiang et al., "Thermally stable voltage-controlled perpendicular magnetic anisotropy in Mo/CoFeB/MgO structures", Applied Physics Letters, vol. 107, Issue 14, 142403, Oct. 2015, pp. 1-5.

Tehrani, S. et al., "Progress and Outlook for MRAM Technology", IEEE Transactions on Magnetics, vol. 35, No. 5, Sep. 1999, pp. 2814-2819.

Slaughter, J.M. et al., "High Speed Toggle MRAM with MgO-Based Tunnel Junctions", IEEE International Electron Devices Meeting 2005, Dec. 5, 2005, 5 pgs.

Clarke, Peter, "MRAM becomes standard product at Freescale <b>(Updated)</b>", Silicon Strategies, Sep. 23, 2004, EETIMES, http://eet.com/article/showArticle.ihtml?articleid=47902247 , 1 pg.

Oh, S.C. et al., "Excellent Scalability and Switching Characteristics in Spin-Transfer Torque MRAM", IEDM 2006, 288, Jan. 2006, pp. 1-3.

PCT Search Report, International Application No. PCT/US2018/020075, Applicant: Headway Technologies, Inc., Mail date: Jun. 22, 2018, 15 pgs.

Mitterer, C. et al., "Radio-frequency sputter deposition of boron nitride based thin films", Journal of Vacuum Science & Technology A7, 2646, (1998) Published Online: Jun. 4, 1998, Accepted: Jan. 1989, vol. 7, Issue 4, doi: 10.1116/1.575767, pp. 2646-2651.

\* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | $CuO$ | -254 |
| Co | $CoO$ | -426 |
| Ni | $NiO$ | -432 |
| Fe | $FeO$ | -488 |
| Fe | $Fe_2O_3$ | -495 |
| Mo | $MoO_2$ | -502 |
| W | $WO_3$ | -509 |
| Sn | $SnO$ | -514 |
| Zn | $ZnO$ | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | $BaO$ | -1056 |
| Hf | $HfO_2$ | -1084 |
| Mg | $MgO$ | -1146 |
| Ca | $CaO$ | -1208 |

MAGNETIC LAYER FOR MAGNETIC RANDOM ACCESS MEMORY (MRAM) BY MOMENT ENHANCEMENT

PRIORITY DATA

The present application is a continuation application of U.S. application Ser. No. 16/728,455, filed Dec. 27, 2019, which is a continuation application of U.S. patent application Ser. No. 16/109,063 filed Aug. 22, 2018, each of which is herein incorporated by reference in its entirety.

RELATED PATENT APPLICATIONS

This application is related to the following: U.S. Pat. No. 9,425,387; U.S. patent application Ser. No. 15/463,113, filed Mar. 20, 2017; and U.S. patent application Ser. No. 15/933,479, filed Mar. 23, 2018; which are herein incorporated by reference in their entirety.

TECHNICAL FIELD

The present disclosure relates to a perpendicularly magnetized magnetic tunnel junction (p-MTJ) comprised of a free layer that has a first interface with a tunnel barrier layer and a second interface with a metal or metal oxide Hk enhancing layer that increase perpendicular magnetic anisotropy (PMA) and thermal stability in the free layer, and in particular to a method of segregating and removing boron from a boron containing free layer thereby further enlarging PMA, and in some cases increasing the magnetoresistive (MR) ratio as well.

BACKGROUND

Perpendicularly magnetized MTJs (p-MTJs) are a major emerging technology for use in embedded magnetic random access memory (MRAM) applications, and standalone MRAM applications. P-MTJ MRAM technology that uses spin-torque (STT-MRAM) for writing of memory bits was described by J. Slonczewski in "Current driven excitation of magnetic multilayers", J. Magn. Magn. Mater. V 159, L1-L7 (1996), and is an increasingly promising candidate for future generations of non-volatile memory to replace embedded flash memory and embedded cache memory (SRAM).

Both MRAM and STT-MRAM have a p-MTJ cell based on a tunneling magnetoresistance (TMR) effect wherein a stack of layers has a configuration in which two ferromagnetic layers are separated by a thin insulating tunnel barrier layer such as MgO. One of the ferromagnetic layers called the pinned layer has a magnetic moment that is fixed in an out-of-plane direction such as the +z direction when the plane of each layer is laid out in the x-axis and y-axis directions. The second ferromagnetic layer has an out-of-plane magnetization direction that is free to rotate to either the +z-axis (parallel or P state) or the z-axis (antiparallel or AP state) direction. The difference in resistance between the P state (Rp) and AP state (Rap) is characterized by the equation (Rap-Rp)/Rp also known as DRR or the MR ratio. It is important for p-MTJ cells to have a large MR ratio, preferably higher than 100%, as the MR ratio is directly related to the read margin for the memory bit, or how easy it is to differentiate between the P state and AP state (0 or 1 bits).

Another critical requirement for p-MTJs is thermal stability to 400° C. that is a typical temperature during back-end-of-line (BEOL) processes when fabricating embedded memory devices in complementary metal-oxide-semiconductor (CMOS) products. A general trend has been to introduce a second metal oxide/free layer (FL) interface similar to the tunnel barrier/FL interface thereby enhancing PMA and Hk within the free layer, and improving thermal stability. Thermal stability (A) is a function of the perpendicular anisotropy field as shown in equation (1):

$$\Delta = \frac{M_S V H_{k_{eff},\perp}}{2k_B T} \quad (1)$$

where $M_S$ is the magnetic saturation value, $H_{k_{eff},\perp}$ is the out-of-plane (perpendicular) anisotropy field, V is the volume of the free layer, and where $k_B$ is the Boltzmann constant, and T is the temperature.

The perpendicular anisotropy field (PMA) of the free layer is expressed in equation (2) as:

$$H_{k_{eff},\perp} = -4\pi M_s + \frac{2K_U^{\perp,s}}{M_s d} + H_{k,x,\perp} \quad (2)$$

where d is the thickness of the free layer, $H_{k,x,\perp}$ is the crystalline anisotropy field in the perpendicular direction, and $K_U^{\perp,s}$ is the surface perpendicular anisotropy of the top and bottom surfaces of the free layer. Thus, PMA is increased with the introduction of a second free layer/metal oxide interface, which enhances the surface (interfacial) perpendicular anisotropy component. Higher PMA is especially important to allow data retention at small device sizes.

Typically, a Fe rich alloy is used as the free layer, and MgO as the tunnel barrier and Hk enhancing layer to enable lattice matching between the layers, and the use of MgO as a spin filtering element, providing an optimum MR ratio and excellent read signal for the device. Moreover, boron is commonly included in the Fe rich alloy that is CoFeB, for example, to allow an amorphous free layer to be deposited that crystallizes during a subsequent anneal to promote lattice matching with the MgO tunnel barrier and Hk enhancing layer. Unfortunately, the presence of boron in the free layer leads to a lower moment ($M_S$) and reduced PMA. Although boron segregates to a certain extent from the magnetic element(s) in FeB or CoFeB during annealing, the desired $M_S$ value of an as-deposited Fe or CoFe layer is never realized. Moreover, the lower $M_S$ value of the boron containing free layer favors a non-uniform reversal mechanism of the free layer during switching from a P to AP state, or vice versa, which in turn lowers the energy barrier for switching and causes lower thermal stability.

An improved process for fabricating a free layer in a p-MTJ is needed so that the advantage of depositing an amorphous boron containing free layer for optimum lattice matching may be retained without leading to a lower $M_S$ and compromising PMA and thermal stability after an anneal step is performed.

SUMMARY

One objective of the present disclosure is to provide a process for forming a boron containing free layer in a p-MTJ that minimizes the $M_S$ reduction effect of boron on the magnetic alloy in the free layer.

A second objective is to provide a method of according to the first objective that does not degrade other p-MTJ magnetic properties including MR ratio.

According to one embodiment of the present disclosure, a p-MTJ stack of layers is deposited wherein a free layer is formed between a metal oxide tunnel barrier layer and a metal or metal oxide Hk enhancing layer. The p-MTJ stack may have a bottom spin valve configuration with the tunnel barrier layer below the free layer, or a top spin valve configuration with the free layer below the tunnel barrier layer.

The free layer may be a single layer or a multilayer structure wherein each of the one or more layers has a composition that is $Fe_xCo_yB_z$ where x>y, y>0, and x+y+z=100 atomic %. In other embodiments, one or more layers in the free layer may have a $(Fe_xCo_yB_z)_wM_{100-w}$ composition where x>50 atomic % of the magnetic elements in the alloy, y>0, and M is one or more metals that are magnetic such as Ni, or non-magnetic as in W, or Mo. Moreover, the free layer thickness is preferably from 10 to 30 Angstroms to promote PMA since a thickness above 30 Angstroms tends to yield an in-plane magnetization. In all embodiments, the B content is preferably sufficiently large to provide an amorphous free layer during deposition to enable greater film uniformity (smoothness). The amorphous character also allows the free layer to crystallize during annealing and thereby have improved lattice matching with the tunnel barrier, and Hk enhancing layer.

A key feature of the present disclosure is a sequence of processes that results in enhanced segregation of boron from the magnetic elements in the free layer, and removal of at least part of the boron content from the free layer. According to one embodiment, the free layer is subjected to a low power plasma treatment (<50 Watts) with an inert gas such as Ar. Thereafter, a natural oxidation (NOX) process is performed where an oxygen flow of about 1 standard cubic centimeter per minute (sccm) or less is applied for a period of around 1 minute to oxidize at least a portion of the B atoms in the free layer. The resulting $B_2O_3$ has a melting point of 720° K (447° C.) considerably less than that of B (mp=2360° K) and is expected to be volatile around ambient temperatures when under low pressure conditions proximate to a vacuum. Accordingly, a post-oxidation plasma treatment at low pressure may be used to assist in the $B_2O_3$ removal process. Once all p-MTJ layers are deposited, including an overlying Hk enhancing layer, and optional uppermost hard mask, an annealing step is performed before or after patterning the p-MTJ stack to form a p-MTJ cell. The annealing may occur during an encapsulation process that electrically isolates adjacent p-MTJ cells. The annealing is expected to further segregate $B_2O_3$ that was not removed by the post-oxidation plasma treatment. The segregated $B_2O_3$ may form an interface with the Hk enhancing layer and an interface with the tunnel barrier layer.

In a bottom spin valve embodiment, a Mg layer may be deposited on the oxidized free layer before the hard mask is formed on the free layer. The Mg layer is believed to react with any excess oxygen from the oxidation step so that the oxygen does not oxidize the free layer magnetic elements. Furthermore, the resulting MgO layer effectively forms a metal oxide/FL interface and serves as the Hk enhancing layer. In a top spin valve embodiment, the Mg layer that is deposited on the oxidized free layer becomes part of the tunnel barrier. Alternatively, a metal other than Mg may be deposited on the oxidized free layer. The metal such as Mo, W, Ta, Zr, Hf, Ti, Sr, Nb, or V should be more easily oxidized (more negative free energy of oxide formation) than Fe and Co in order to efficiently absorb and react with excess oxygen in the free layer. However, some metals including W and Mo may remain in a substantially unoxidized state on the oxidized free layer and still provide considerable interfacial perpendicular anisotropy at the FL interface to enhance PMA in the free layer.

DETAILED DESCRIPTION

Figure 1:
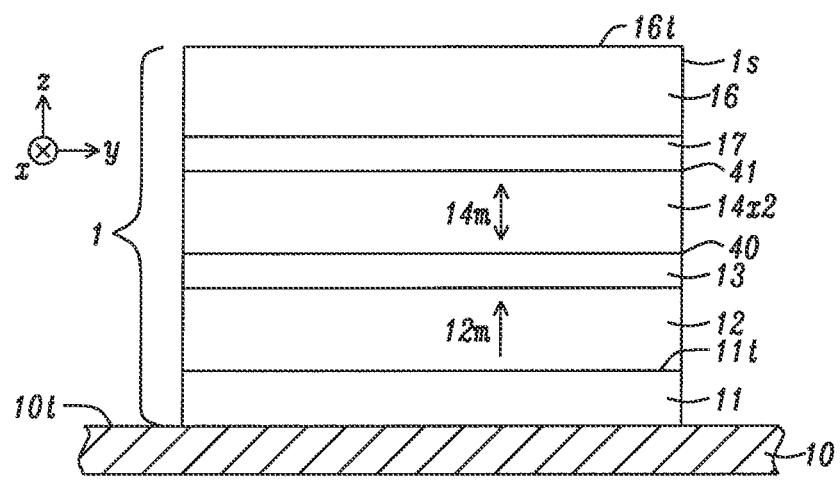
FIG. 1 is a cross-sectional view showing a p-MTJ cell wherein a free layer is formed between a tunnel barrier layer and a Hk enhancing layer in a bottom spin valve configuration according to an embodiment of the present disclosure.

The present disclosure is a method of fabricating p-MTJ cells for embedded memory applications wherein a boron containing free layer is subjected to a natural oxidation in order to selectively oxidize boron atoms which may then partially or completely segregate from the free layer with an optional post-oxidation plasma treatment, and an anneal step. The p-MTJ may be incorporated in a MRAM, STT-MRAM, or another spintronic device such as a spin torque oscillator (STO), magnetic sensor, or biosensor. Only one p-MTJ cell is depicted in the drawings, but typically millions of p-MTJ cells are arrayed in rows and columns on a substrate during fabrication of a memory device. A top surface of a layer is defined as a surface facing away from the substrate while a bottom surface faces the substrate. An interface is a boundary region comprised of a bottom surface of one layer and an adjoining top surface of a second layer. A thickness of each layer is in the z-axis direction, and a plane (top or bottom surface) is laid out in the x-axis and y-axis directions. The terms magnetic moment and magnetization may be used interchangeably.

In related U.S. Pat. No. 9,425,387, we disclosed a Hk enhancing layer that may be one or both of MgO and BOx, and a diffusion barrier to prevent non-magnetic metal migration from the hard mask through the Hk enhancing layer and into the free layer (FL). Accordingly, PMA is improved because the FL magnetic moment ($M_S$) is not diluted and interfacial perpendicular anisotropy at the FL/Hk enhancing layer interface is maintained. In related U.S. patent application Ser. No. 15/933,479, we described an optimized composition for a free layer that has an Fe rich portion at each interface with a tunnel barrier layer and Hk enhancing layer, and a CoFeB middle portion to simultaneously achieve thermal stability to 400° C. process temperatures, MR ratio above 100%, RA product <5 ohm-µm², and switching voltage <0.15V (DC), especially for p-MTJ critical dimensions <60 nm. Now we have discovered how to promote boron segregation from a boron containing free layer, especially in an upper portion proximate to a Hk enhancing layer in a bottom spin valve configuration to promote an Fe rich content and further enhance magnetic properties including $M_S$, PMA, and thermal stability.

FIG. 1 depicts a patterned p-MTJ 1 according to a first embodiment of the present disclosure wherein an optional seed layer 11, pinned layer 12, tunnel barrier layer 13, free layer 14x2, Hk enhancing layer 17, and hard mask 16 are sequentially formed on a top surface 10t of a substrate that is a bottom electrode 10 in a MRAM structure, for example. Sidewall is on the p-MTJ cell is formed during a conventional photoresist patterning and etching sequence where a pattern formed in a photoresist layer (not shown) on top surface 16t of the hard mask is etch transferred through the underlying p-MTJ stack of layers as explained later. Free layer magnetization 14m is free to rotate parallel or anti-parallel to the pinned layer magnetization 12m in this bottom spin valve embodiment. Interfacial perpendicular anisotropy generated at interface 40 with the tunnel barrier layer and at interface 41 with the Hk enhancing layer contributes to PMA in the free layer.

Figure 2:
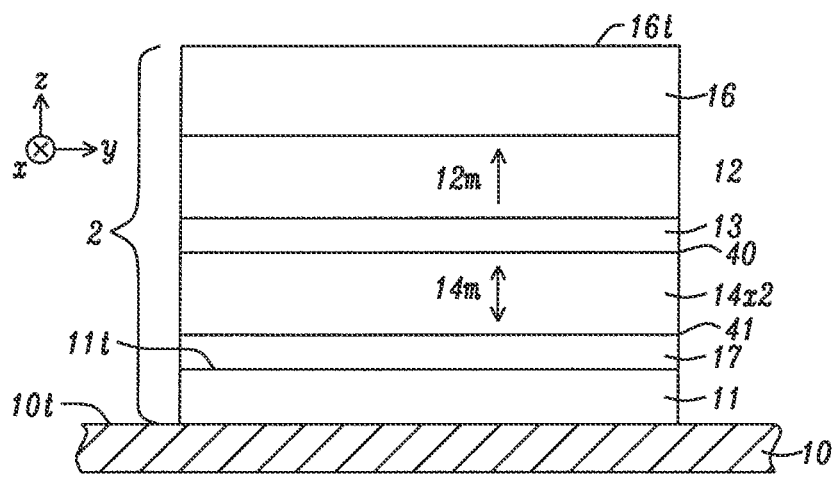
FIG. 2 is a cross-sectional view showing a p-MTJ cell wherein a free layer is formed between a Hk enhancing layer and a tunnel barrier layer in a top spin valve configuration according to another embodiment of the present disclosure.

According to another embodiment of the present disclosure shown as p-MTJ 2 in FIG. 2, a top spin valve configuration is illustrated where the p-MTJ layers are retained from FIG. 1 except they are stacked in a different order. Here, the optional seed layer 11, Hk enhancing layer 17, free layer 14x2, tunnel barrier 13, reference layer 12, and hard mask 16 are sequentially formed on a substrate comprised of an uppermost bottom electrode 10.

The present disclosure encompasses a first embodiment relating to FIGS. 3-10 where a p-MTJ with a bottom spin valve configuration is formed, and a second embodiment depicted in FIGS. 11-15 where a p-MTJ with a top spin valve embodiment is fabricated.

Figure 3:
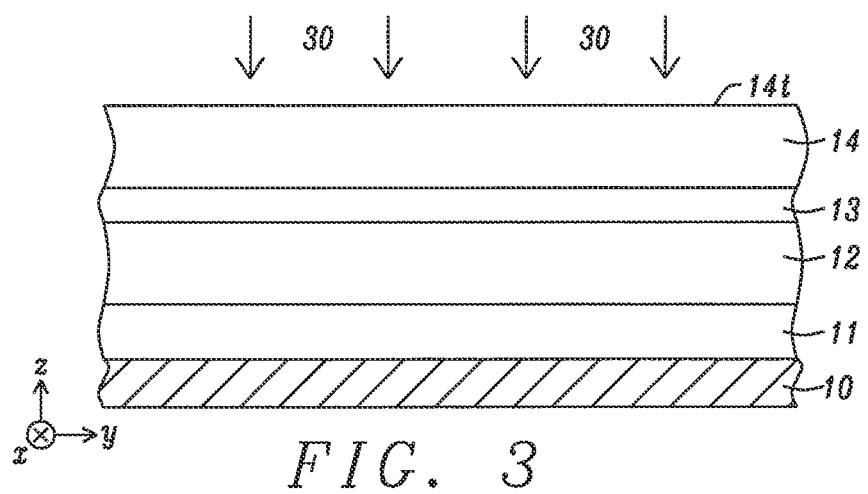
FIG. 3 is a cross-sectional view showing a first step in a process according to an embodiment of the present disclosure wherein a free layer in a partially formed p-MTJ stack is subjected to a plasma treatment before an oxidation step.

Referring to FIG. 3, a key feature of the present disclosure is the fabrication of a boron containing free layer wherein boron is subsequently segregated as an oxide, and preferably at least partially removed before forming overlying layers. The fabrication of the p-MTJ stack of layers is not limited to a particular composition for the layers above and below the free layer. For example, the seed layer 11 may be comprised of one or more of NiCr, Ta, Ru, Ti, TaN, Cu, Mg, or other materials typically employed to promote a smooth and uniform grain structure in overlying layers.

Reference layer 12 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 (outer pinned) layer is formed on the seed layer 11 in FIG. 1 or adjoins the hard mask 16 in FIG. 2. AP1 is the inner pinned layer and typically contacts the tunnel barrier. One or both of the AP1 and AP2 layers may be comprised of CoFe, CoFeB, Fe, Co, or a combination thereof. In other embodiments, one or both of the AP1 and AP2 layers may be a laminated stack with inherent PMA such as $(Co/Ni)_n$, $(CoFe/Ni)_n$, $(Co/NiFe)_n$, $(Co/Pt)_n$, $(Co/NiCo)_n$, $(Co/Pd)_n$, or the like where n is the lamination number.

Tunnel barrier layer 13 is preferably a metal oxide that is one of MgO, TiOx, AlTiO, MgZnO, $Al_2O_3$, ZnO, ZrOx, HfOx, or MgTaO, or a lamination of one or more of the aforementioned metal oxides. More preferably, MgO is selected as the tunnel barrier layer because it provides the highest MR ratio.

Free layer 14 is deposited as a boron containing layer and may be a single layer, or a multilayer wherein at least one layer contains boron. In embodiments where the free layer (FL) is a single layer, the free layer is preferably Fe rich and has a composition $Fe_xCo_yB_z$ where x>y, y>0, and x+y+z=100 atomic %. In other embodiments, there may be one or more additional elements in the free layer to provide a $(Fe_xCo_yB_z)_wM_{100-w}$ composition where x>50 atomic % of the magnetic elements therein, y>0, and M is one or more metals that are magnetic such as Ni, or non-magnetic as in W, Cr, Mg, Zr, Hf, Nb, Ta, Ti, Sr, V, or Mo.

As disclosed in related U.S. patent application Ser. No. 15/933,479, when the free layer 14 has a trilayer composition, the FL configuration is preferably FeB/CoFeB/Fe or FeB/CoFeB/FeB when the Fe or FeB layer contacts a W or Mo Hk enhancing layer. One advantage of a FeB layer contacting the tunnel barrier layer 13 is that a MgO/FeB interface 40 provides enhanced Hk compared with a MgO/CoFeB interface. However, a single free layer that is FeB does not afford a high MR ratio simultaneously with enhanced Hk. Therefore, a certain amount of Co is employed in the iron rich FeCoB middle layer. Since Co has a lower affinity for oxygen than Fe, Co is advantageously used in the middle portion of the free layer to block oxygen migration from the tunnel barrier layer to the Fe or FeB layer on the opposite side of the FL middle portion thereby maintaining PMA that results from interface 41 with the Hk enhancing layer 17 in the final device. The addition of Co to a FeB alloy in the middle layer also enhances the MR ratio. It is also important that the free layer portion contacting the Hk enhancing layer is Fe or an Fe-rich material to minimize or avoid a dead zone having little or no PMA that results when Co or a Co alloy such as CoFeB intermixes with a W, Mo, Mo alloy, or W alloy layer. Thus, a Fe or Fe-rich FeB layer has essentially no intermixing with W, Mo, or alloys thereof and thereby provides a maximum Hk value resulting from interface 41 in FIG. 1 (or FIG. 2). It is noted a FeB/FeCoB/Fe trilayer where the Fe layer contacts the Hk enhancing layer provides the highest merit of value shown as the product of MR ratio and Hk.

According to one embodiment of the p-MTJ fabrication process flow of the present disclosure, p-MTJ layers 11-14 described previously are sequentially formed on the substrate 10 as shown in FIG. 3. A first plasma treatment 30 is performed and is comprised of a low radiofrequency (RF) power of <50 Watts and a flow of inert gas that is one of Ar, Kr, Xe, or Ne for a certain period of time, typically less than 1 minute. Although not bound by theory, the plasma treatment is believed to modify the FL top surface 14t with one or both of the following results: (a) improved film uniformity or smoothness; and (b) enabling a more controlled oxidation in the subsequent step, presumably by modifying the FL surface chemistry. The first plasma treatment (PT), also known as the pre-oxidation PT, may be performed in a chamber within a sputter deposition tool.

Figure 4:
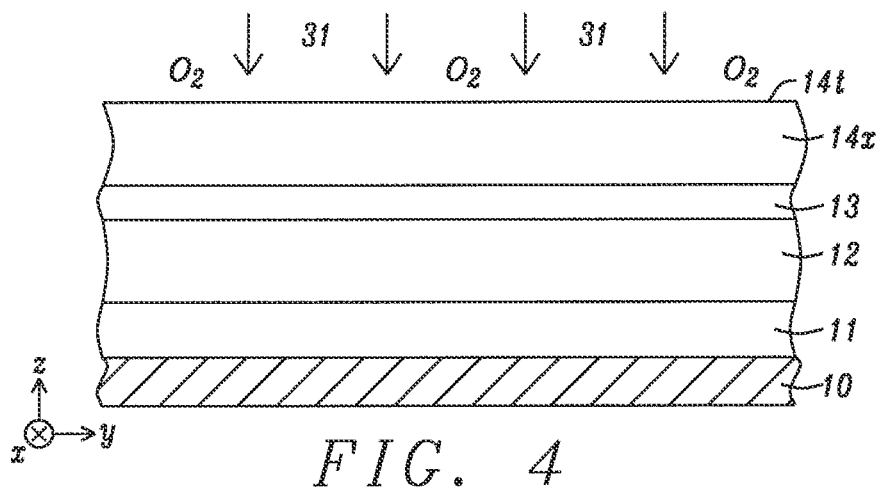
FIG. 4 is a cross-sectional view of the partially formed p-MTJ in FIG. 3 where the free layer is oxidized according to an embodiment of the present disclosure.

Referring to FIG. 4, a key feature of all embodiments in the present disclosure is a natural oxidation (NOX) process 31 that involves subjecting the FL top surface 14t to a flow of oxygen, preferably from 0.1 to 1 sccm, for a period of about 1 second to 600 seconds, and preferably 1 minute or less. The oxidation may be performed in an oxidation chamber within a sputter deposition tool. In some embodiments, the NOX process is carried out in the same chamber as the pre-oxidation PT 30 to improve throughput. Boron, which has an affinity for oxygen that is greater than Fe, Co, or Ni, is oxidized to $B_2O_3$ at least in an upper portion of free layer 14x, depending on the time and magnitude of $O_2$ flow during the NOX process. The extent of oxidation is also dependent on FL thickness, preferably 10 to 30 Angstroms, and the B content in the free layer. Thus, as FL thickness increases and B content becomes larger, $B_2O_3$ formation may be limited to an upper portion of the free layer, especially for weaker NOX conditions.

Figure 5:
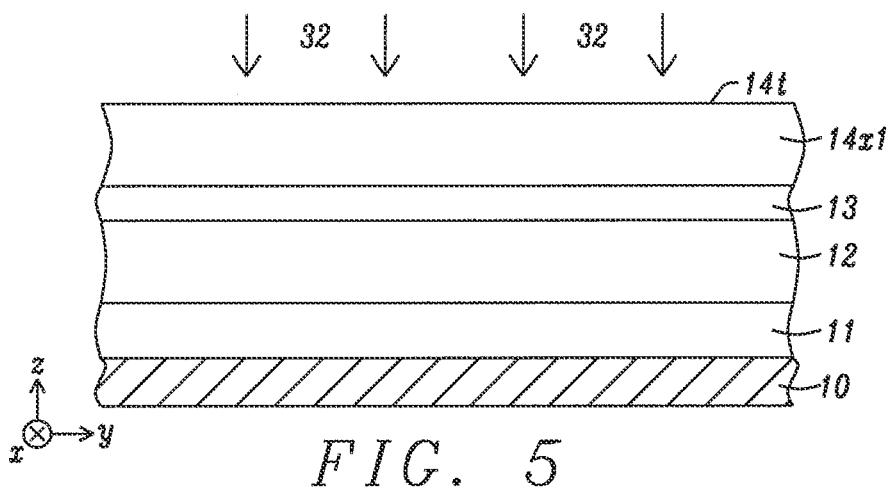
FIG. 5 is a cross-sectional view of a partially formed p-MTJ stack wherein an oxidized free layer is subjected to a plasma treatment according to another embodiment of the present disclosure.

FIG. 5 depicts an embodiment of the present disclosure where a post-oxidation PT 32 follows NOX process 31. The post-oxidation PT may be carried out in the same oxidation chamber as the NOX process to improve throughput, and may comprise a RF power <50 Watts with an inert gas flow for a period of 1 second to 600 seconds. The post-oxidation PT is believed to remove $B_2O_3$ that forms at or proximate to FL top surface 14t. The resulting free layer 14x1 has a lower B content than in originally deposited FL 14. Note that the post-oxidation PT comprises a partial vacuum that assists in removing volatile $B_2O_3$, and is sufficiently controlled to remove a maximum of 1 or 2 Angstroms of material from the FL top surface. In some embodiments, only the pre-oxidation PT or only the post-oxidation PT are performed while in other embodiments, both of the pre-oxidation PT and post-oxidation PT are employed in the process sequence with the NOX process that modifies the free layer composition.

Figure 6:
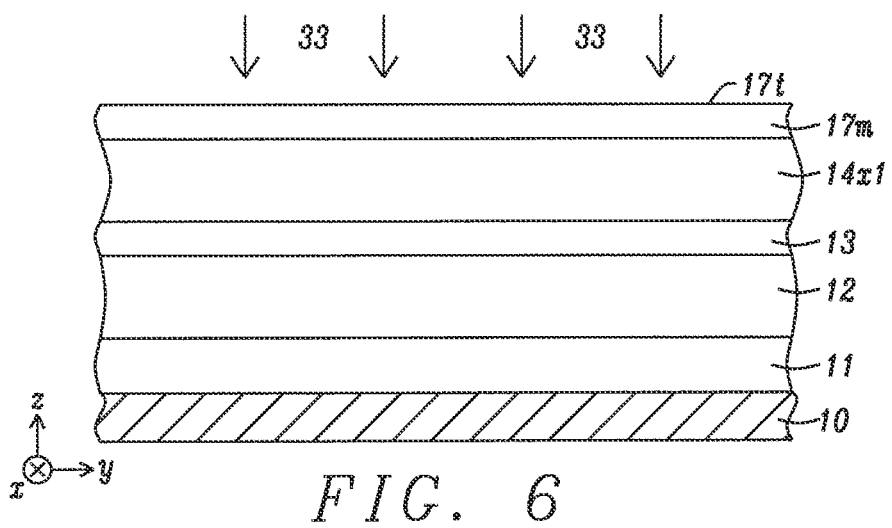
FIG. 6 is a cross-sectional view of the partially formed p-MTJ stack in FIG. 5 after a metal such as Mg is deposited on the oxidized free layer according to an embodiment of the present disclosure.

Referring to FIG. 6, a preferred embodiment of the present disclosure is shown where a metal layer 17m, preferably Mg, is deposited on the FL top surface 14t following either the NOX process 31, or the post-oxidation PT 32 when the latter is included in the fabrication sequence. The metal layer preferably has a thickness from 3 to 10 Angstroms, and a free energy of oxide formation that is more negative than Fe in the table depicted in FIG. 19. In other words, the metal layer is advantageously employed to scavenge unreacted oxygen from the free layer 14x1 and thereby prevent undesirable oxidation of the FL magnetic elements to avoid degradation of FL PMA. The Hk enhancing layer 17 in the final device may have a stoichiometric oxidation state with essentially no unoxidized metal atoms, or may have a non-stoichiometric state where a substantial number of metal atoms remain unoxidized. In a bottom spin valve embodiment, the metal layer is transformed to a metal oxide Hk enhancing layer 17 in the final device to provide interfacial magnetic anisotropy at interface 41 described earlier. However, in a process (described later) of forming a top spin valve embodiment as in FIG. 2, the resulting MgO layer or optional metal oxide becomes the tunnel barrier layer 13.

In an alternative embodiment, the metal layer 17m may be W, Mo, Ta, Zr, Hf, Ti, Sr, Nb, V, or an alloy thereof, for example, having a free energy of oxide formation proximate to that of Fe. Since a W or Mo metal layer is considerably less reactive with oxygen than Mg, a W or Mo metal layer may remain in a substantially unoxidized state throughout the p-MTJ fabrication process. Accordingly, the resulting Hk enhancing layer 17 is likely to have a non-stoichiometric oxidation state when the metal therein is W or Mo. It should be understood that even in an embodiment where the metal layer is W, Mo, or an alloy thereof, the resulting interface 41 generates an acceptable Hk enhancement in the adjoining free layer 14x1. However, the portion of the free layer adjoining a W or Mo Hk enhancing layer should be devoid of Co to prevent intermixing with W or Mo and degrading the FL PMA.

Figure 7:
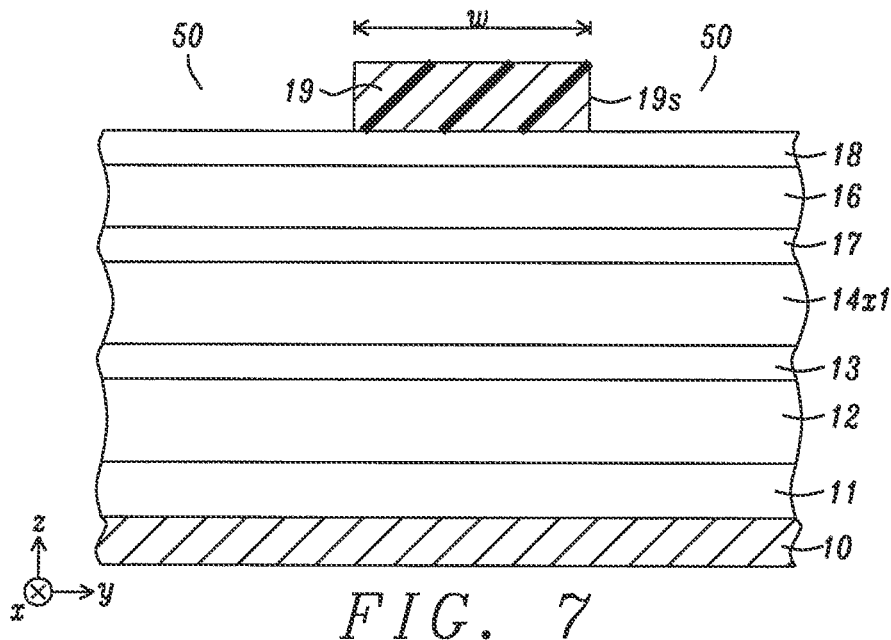
FIG. 7 is a cross-sectional view after all layers in the p-MTJ stack with a bottom spin valve configuration are deposited, and a photoresist pattern is formed thereon according to an embodiment of the present disclosure.

Referring to FIG. 7, the remainder of the MTJ stack is deposited once the Hk enhancing layer 17 is formed. In particular, a hard mask 16 also known as a capping layer is formed as the uppermost layer on a top surface 17t of the Hk enhancing layer. The hard mask is non-magnetic and generally comprised of one or more conductive metals or alloys including but not limited to Ta, Ru, TaN, Ti, TiN, and W. Optionally, other hard mask materials including MnPt may be selected in order to provide high etch selectivity relative to underlying MTJ layers during an etch process that forms MTJ cells with sidewalls that stop on the bottom electrode. Moreover, the hard mask may comprise an electrically conductive oxide such as RuOx, ReOx, IrOx, MnOx, MoOx, TiOx, or FeOx.

A dielectric bottom antireflective coating (DARC) or bottom antireflective coating (BARC) 18 is deposited or spin coated on the hard mask, and then a photoresist layer 19 is coated and baked on the DARC or BARC. The photoresist layer is patterned with a conventional photolithography method to provide an array of island features each having a critical dimension w and sidewall 19s that is surrounded by opening 50. Opening 50 exposes a top surface of the DARC/BARC layer. In some embodiments where the photoresist island feature is circular, w is formed in both of the x-axis and y-axis directions. In other embodiments, the photoresist island feature may have an elliptical or polygonal shape where the x-axis dimension is different from w.

Figure 8:
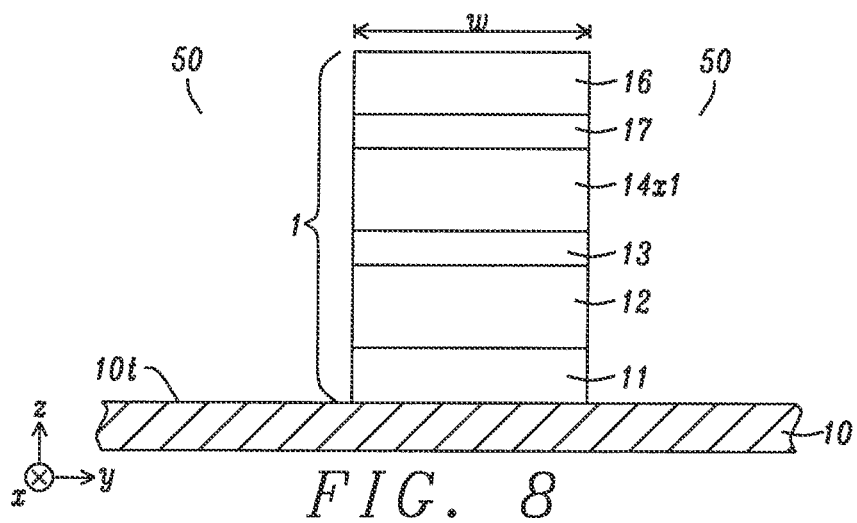
FIG. 8 is a cross-sectional view of the p-MTJ stack of layers in FIG. 7 after an etch process is performed to form a p-MTJ cell.

In the following step shown in FIG. 8, the photoresist island 19 serves as an etch mask as opening 50 is etch transferred through the exposed portions of the p-MTJ stack of layers and stops on top surface 10t of the bottom electrode 10 thereby generating p-MTJ cell 1. The etch process may comprise one or both of reactive ion etch (RIE) and ion beam etch (IBE). During an intermediate step where the opening is transferred through the DARC/BARC 18 and hard mask 16, the photoresist layer may be removed by the etch chemistry. In some embodiments, the photoresist layer is stripped with a separate process after the hard mask etch. The DARC/BARC layer may be removed during the etch process through the underlying layers 11-13, FL 14x1, and Hk enhancing layer 17, or during a chemical mechanical polish (CMP) process explained below.

Figure 9:
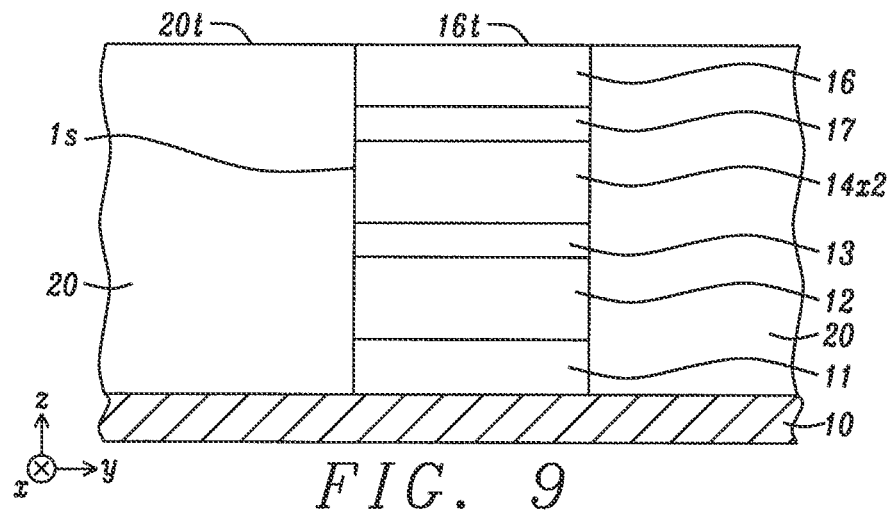
FIG. 9 is a cross-sectional view of the p-MTJ cell in FIG. 8 after an encapsulation process is performed.

Referring to FIG. 9, an encapsulation process is performed wherein one or more dielectric layers are deposited to fill opening 50 and contact p-MTJ sidewall 1s. We have described a preferred encapsulation process in detail in related U.S. patent application Ser. No. 15/463,113. In some embodiments, an anneal is performed in an inert gas atmosphere at a temperature from 360° C. to 400° C. after forming p-MTJ cell 1 (and before the encapsulation process) to segregate $B_2O_3$ from the free layer and form FL 14x2 as in FIG. 1. In other embodiments, the anneal may be carried out during the encapsulation process and transform FL 14x1 in FIG. 8 to FL 14x2 in FIG. 9. Furthermore, more than one anneal may be employed during the p-MTJ fabrication process. In all embodiments, the anneal should comprise a temperature of at least 100° C., and preferably >300° C. in order to crystallize the free layer. As indicated earlier, the one or more anneal steps preferably segregate $B_2O_3$ from the free layer such that the $B_2O_3$ forms an interface with the Hk enhancing layer 17, and effectively becomes part of the Hk enhancing layer. Thereafter, a CMP process is used as a planarization step to form a hard mask top surface 16t that is coplanar with a top surface 20t of the encapsulation layer 20.

Figure 10:
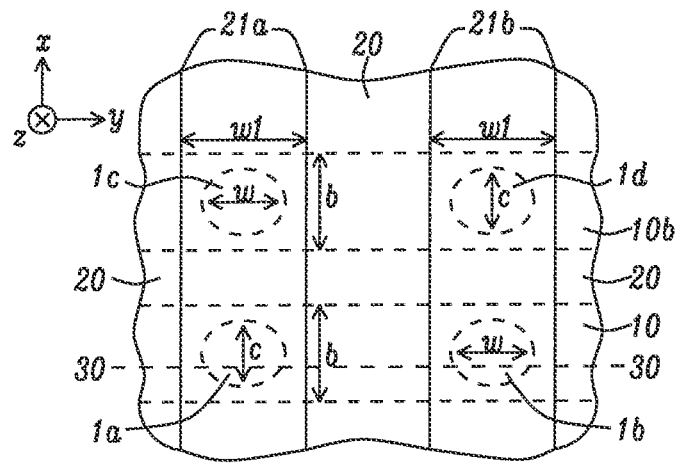
FIG. 10 is a top-down view of a plurality of p-MTJ cells that are formed in an array of rows and columns between a top electrode and bottom electrode.

FIG. 10 depicts a top-down view of a plurality of encapsulated p-MTJ cells laid that are formed in an array of rows and columns and separated by encapsulation layer 20. Bottom electrode (BE) 10 is formed below a row of p-MTJ cells comprised of p-MTJ cells 1a, 1b, and a second bottom electrode 10b is aligned parallel to BE 10 and is below a second row of p-MTJ cells comprised of p-MTJ cells 1c, 1d. Top electrodes 21a, 21b are formed on encapsulation layer 20 and within a dielectric layer (not shown), and contact a top surface of p-MTJ cells 1a, 1c and p-MTJ cells 1b, 1d, respectively. The top electrodes have a lengthwise direction along the x-axis and are aligned orthogonal to BE 10 and BE 10b. As mentioned previously, when the p-MTJ cells are circular, critical dimension w in the y-axis direction equals critical dimension c in the x-axis direction. Alternatively, c is unequal to w. Widthwise dimensions b and w1 of the bottom electrodes and top electrodes, respectively, are generally greater than c and w, respectively. Note that the cross-sectional view in FIG. 9 is taken at plane 30-30 where p-MTJ cell 1 may be either of p-MTJ cell 1a or 1b in FIG. 10.

Figure 11:
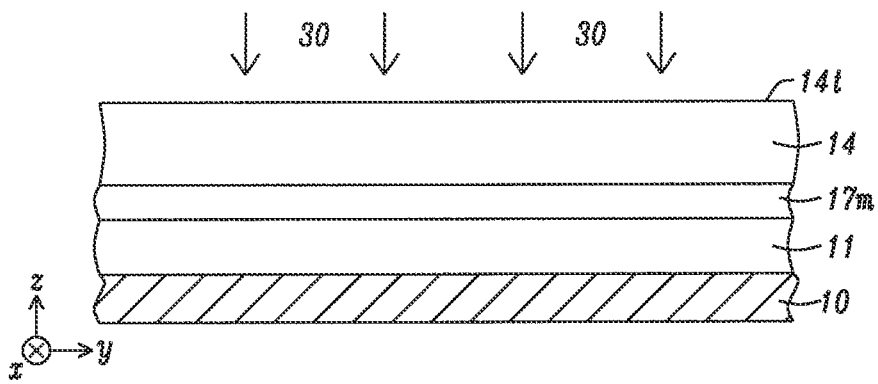
FIGS. 11-15 are cross-sectional views depicting a sequence of steps in forming a top spin valve p-MTJ stack wherein a boron containing free layer is oxidized according to an embodiment of the present disclosure.

According to another embodiment of the present disclosure wherein a p-MTJ cell with a top spin valve configuration is fabricated, the initial process flow involves sequentially depositing optional seed layer 11, metal layer 17m, and free layer 14 on bottom electrode 10. Then, as depicted in FIG. 11, a pre-oxidation PT 30 described previously may be performed to prepare free layer top surface 14t for oxidation.

Figure 12:
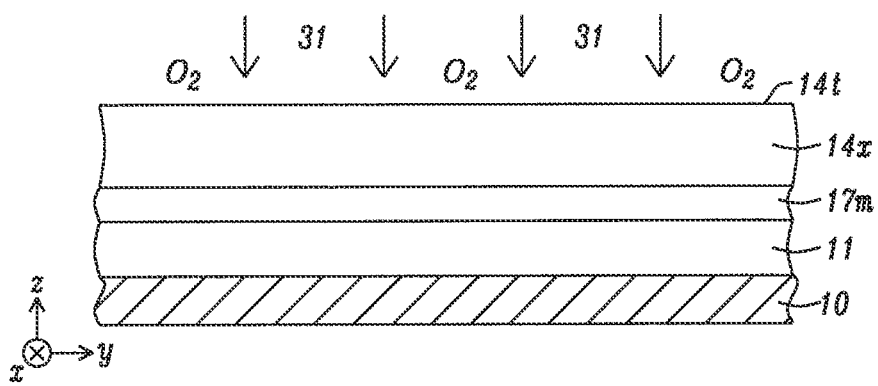
Figure 13:
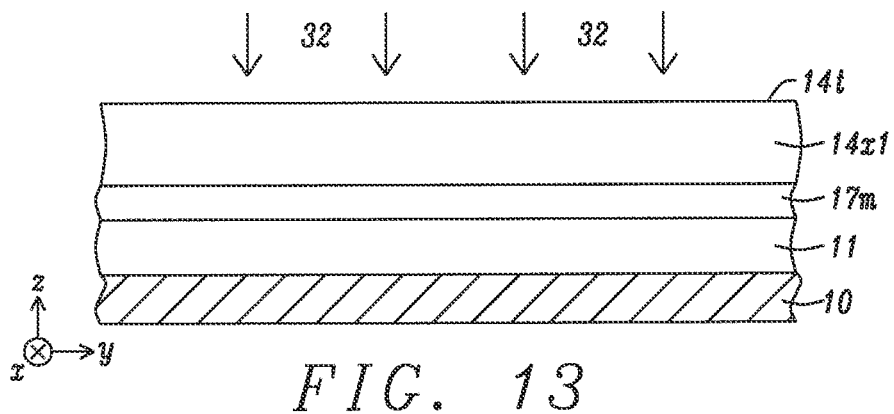

Thereafter, in FIG. 12, the previously described NOX process 31 is performed and at least partially oxidizes boron within the free layer to form free layer 14x that now contains $B_2O_3$. Referring to FIG. 13, the optional post-oxidation PT 32 may be used to remove $B_2O_3$ at or proximate to top surface 14t.

Figure 14:
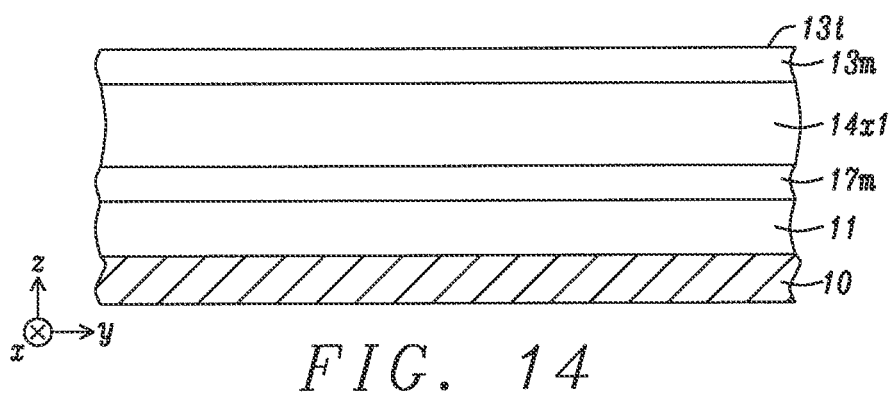
Figure 15:
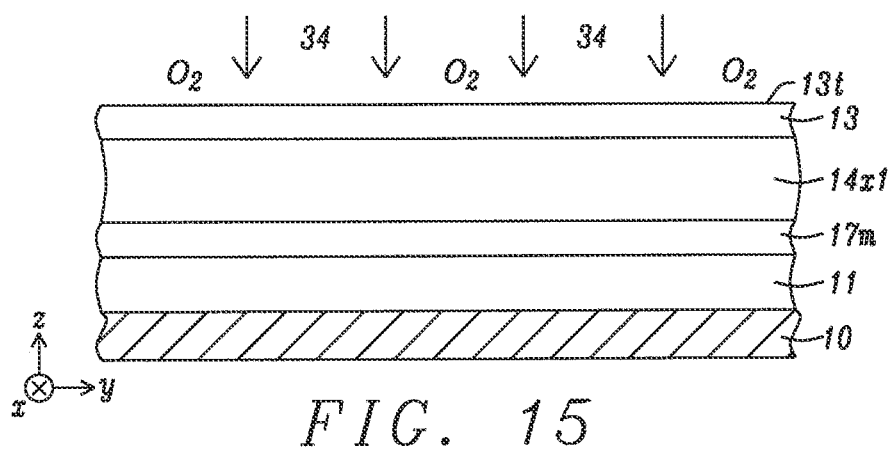

In the following step shown in FIG. 14, a metal layer 13m such as Mg is deposited on the free layer top surface 14t. The metal layer may react with loosely bound oxygen in the free layer 14x1 to partially oxidize the metal layer. Thereafter, in FIG. 15, a NOX process 34 may be performed to further oxidize the metal layer and transform to a tunnel barrier layer 13. In alternative embodiments (not shown), the sequence of depositing a metal (Mg) layer followed by NOX process 34 may be repeated one or more times. Furthermore, an uppermost metal layer may be deposited on the tunnel barrier layer after the final NOX process. Note that the uppermost metal layer subsequently reacts with loosely bound oxygen in the tunnel barrier and with oxygen that diffuses out of adjacent layers, and becomes at least partially oxidized as the uppermost portion of the tunnel barrier layer.

The final steps in forming a p-MTJ stack with a top spin valve configuration comprise depositing reference layer 12 on tunnel barrier layer top surface 13t, and then depositing hard mask 16 on the reference layer. The previously described sequence of patterning a photoresist layer (FIG. 7), etch transfer of the pattern through the p-MTJ stack of layers (FIG. 8), and encapsulation (FIG. 9) are then followed to form p-MTJ cell 2 in FIG. 2. An anneal may be performed before or during encapsulation. Moreover, more than one anneal may be employed during the p-MTJ cell fabrication. Note that metal layer 17m is transformed to Hk enhancing layer 17 as a result of the one or more anneals. As mentioned previously, the Hk enhancing layer may have a stoichiometric oxidation state or a non-stoichiometric oxidation state.

To test the hypothesis of oxidizing a boron containing free layer to improve the magnetic moment therein, we prepared two stacks of layers on a substrate. Each stack had a TiN50/Mo5/Co$_2$oFe601320X/Mo10/TiN50/Ru100 configuration where the thickness in Angstroms of each layer is the number following the composition, and thickness X for the CoFeB layer was varied from 10 Angstroms to 30 Angstroms. On the first wafer, the Co2oFesoB20 layer was not oxidized prior to depositing the Mo/TiN/Ru stack of layers. The Co2oFe601320 layer on the second wafer was treated with a NOX process comprised of 1 sccm of oxygen for 60 seconds before depositing the Mo/TiN/Ru stack. Thereafter, an anneal was performed at various conditions.

Figure 16A:
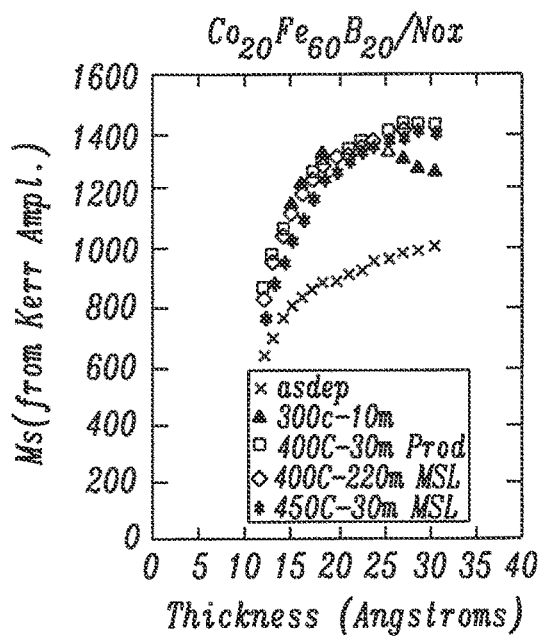
FIGS. 16A-16B are plots of $M_S$ vs. free layer thickness for an oxidized CoFeB layer and an unoxidized CoFeB layer, respectively.
Figure 16B:
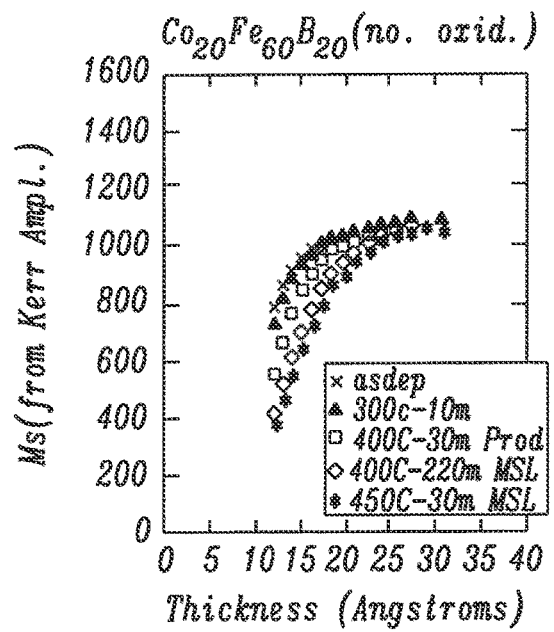

Magnetization saturation ($M_S$) was measured as a function of CoFeB thickness, and the results are shown in FIG. 16A for the wafer with the oxidized CoFeB layer, and in FIG. 16B for the wafer with the unoxidized CoFeB layer. We observe that the oxidized CoFeB layer exhibits a higher moment ($M_S$) for a given thickness compared with the unoxidized CoFeB layer after all anneal conditions. In the as-deposited state, the unoxidized CoFeB layer has a slightly higher $M_S$ value. Four different anneal conditions were studied including 300° C. for 10 minutes, 400° C. for 30 minutes on a Producer stage, 400° C. for 220 minutes in an oven, and 450° C. for 30 minutes in an oven, and all conducted in an inert atmosphere. Data indicates that annealing enhances $M_S$ in the oxidized CoFeB layer. On the other hand, annealing tends to lower $M_S$ compared with the as-deposited state in the unoxidized CoFeB layer. The increase in magnetic moment in FIG. 16A is attributed to oxidation of boron in the CoFeB layer, and improved segregation of $B_2O_3$ to one or both interfaces with the adjoining Mo layers.

Figure 17A:
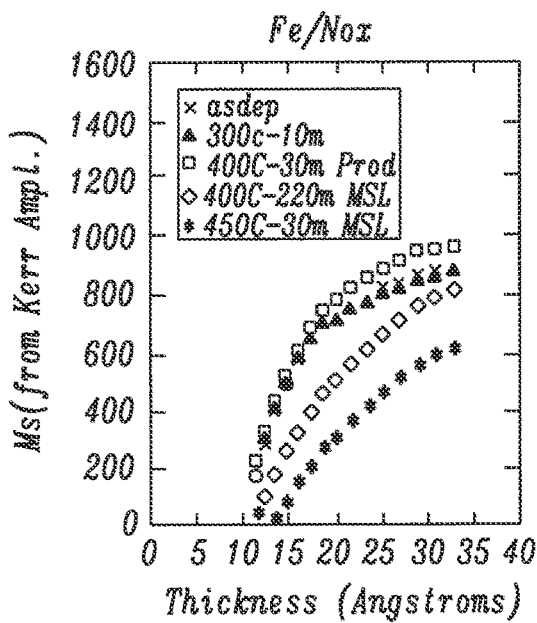
FIGS. 17A-17B are plots of $M_S$ vs. free layer thickness for an oxidized Fe layer and an unoxidized Fe layer, respectively.
Figure 17B:
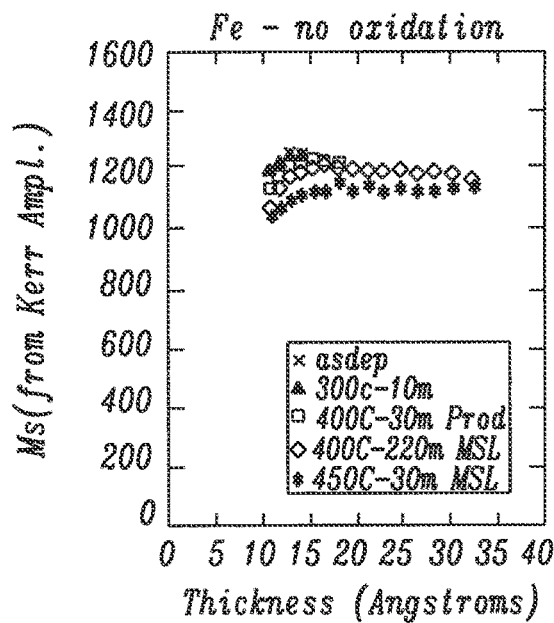

To further verify the hypothesis, we prepared two stacks of layers similar to the previous experiment except the oxidized CoFeB layer and unoxidized CoFeB layer were replaced with an oxidized Fe layer and unoxidized Fe layer, respectively. Since the magnetic Fe layer does not contain boron, we would expect no improvement of the magnetic moment during anneal in the oxidized sample. Results are illustrated in FIG. 17A and FIG. 17B for the oxidized Fe layer, and unoxidized Fe layer, respectively. As in the previous experiment, the oxidized magnetic (Fe) layer in the as-deposited form (before anneal) has a lower $M_S$ value than the unoxidized Fe layer. However, unlike the oxidized CoFeB layer, the magnetic moment of the oxidized Fe layer decreases substantially during all anneal conditions. Thus, the wafer where the Fe layer was subjected to the NOX process has a lower $M_S$ value as would be expected due to the oxidation of Fe. In conclusion, oxidation of a free layer advantageously enhances the magnetic moment (PMA) therein only when the free layer contains boron, and after at least one anneal step is performed according to an embodiment of the present disclosure.

To demonstrate the benefits of a p-MTJ wherein a boron containing free layer is subjected to a NOX process, we performed an experiment to compare a p-MTJ stack fabricated according to a process of record (POR) with a p-MTJ stack formed according to an embodiment of the present disclosure. The base film structure employed for all p-MTJ stacks is seed layer/pinned layer/MgO/Co$_2$oFe$_6$062$_0$15/Mg/Mo/TiN/Ru wherein the CoFeB free layer has a 15 Angstrom thickness. Here, MgO is the tunnel barrier, the Mo layer is the Hk enhancing layer for the FL, and TiN/Ru is the hard mask. For the POR (comparative example), no additional processing was performed on the free layer after deposition. The p-MTJ fabrication sequence according to an embodiment of the present disclosure included two additional processes involving the free layer. First, a pre-oxidation PT comprised of 10 Watts RF power, and 200 sccm Ar for 30 seconds was performed, and then the free layer was exposed to a NOX process with a 5 sccm flow rate of oxygen for 60 seconds before the Mg layer was deposited.

Figures 18, 19:
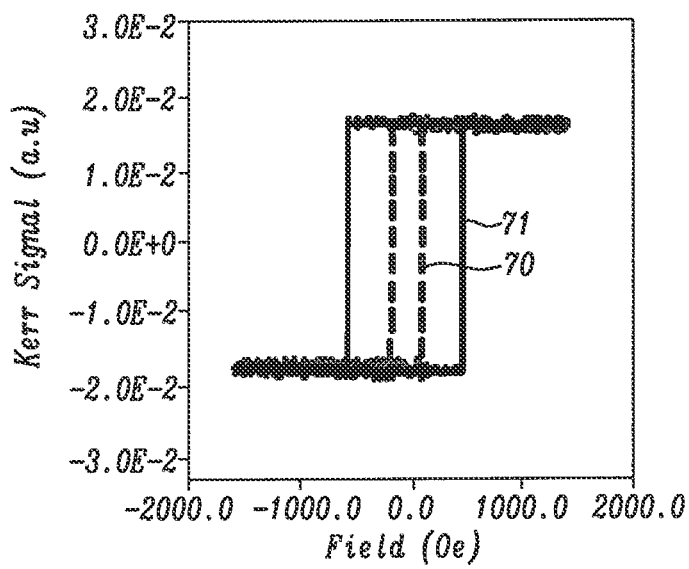
FIG. 18 is a plot of Kerr signal vs. magnetic field that compares results of a p-MTJ stack having an oxidized CoFeB free layer according to present disclosure, and a conventional p-MTJ stack where the CoFeB free layer is not oxidized.
FIG. 19 is a table showing the free energy of oxide formation for various metals.

After all p-MTJ layers were deposited, each stack was annealed at 400° C. for 200 minutes in an oven. FIG. 18 shows a hysteresis loop measured by Kerr magnetometry at full film level after the anneal step was completed. The anisotropy field for the p-MTJ stack made using a process sequence of the present disclosure (solid line 71) clearly has substantially higher PMA than for the comparative example (dashed line 70). Actual anisotropy field determined by ferromagnetic resonance for the p-MTJ stack formed according to an embodiment of the present disclosure is 5800 Oe. Resistance x area (RA) product and MR ratio were measured by CIPT and found to be 5.5 ohm-$\mu m^2$ and 116.2%, respectively. Therefore, the results confirm that direct oxidation of a boron containing free layer produces a free layer with improved anisotropy field that translates into higher PMA than in the POR example following an anneal step.

All of the embodiments described herein may be incorporated in a manufacturing scheme with standard tools and processes. P-MTJ cells formed according to preferred embodiments disclosed herein have an acceptable RA, MR ratio >100%, and sufficient anisotropy field to provide improved thermal stability to 400° C. process temperatures compared with POR p-MTJ cells. We believe overall p-MTJ performance is an improvement over the prior art and thereby enables higher process yields of advanced product nodes such 64 Mb and 256 Mb STT-MRAM technology, and related spintronic devices where RA product, MR ratio, and thermal stability are all critical parameters.

While the present disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
    forming a free layer over a substrate, the free layer including boron;
    performing a first oxidation process on the free layer to convert boron to boron oxide in the free layer;
    forming a metal layer on the free layer; and
    segregating a first portion of the boron oxide from the free layer.
2. The method of claim 1, further comprising performing a treatment process on the free layer prior to the performing of the first oxidation process, wherein the treatment process modifies a top surface of the free layer by increasing a uniformity or smoothness of the top surface of the free layer.
3. The method of claim 1, wherein the metal layer includes a material selected from the group consisting of Mg, W, Mo, Ta, Zr, Hf, Ti, Sr, Nb and V.
4. The method of claim 1, wherein the performing of the first oxidation process on the free layer includes subjecting the free layer to a flow of oxygen in a range from about 0.1 standard cubic centimeter per minute (sccm) to about 1 sccm.
5. The method of claim 1, further comprising performing a second oxidation process on the metal layer to from a metal oxide layer.
6. The method of claim 1, wherein the segregating of the first portion of the boron oxide from the free layer includes the segregated first portion of the boron oxide forming an interface with the metal layer.
7. The method of claim 1, further composing removing a second portion of the boron oxide prior to the forming of the metal layer on the free layer.
8. The method of claim 1, further comprising:
    forming a seed layer over the substrate;
    forming a reference layer over the seed layer;
    forming a tunnel barrier layer over the reference layer, wherein forming the free layer over the substrate includes forming the free layer over the tunnel barrier layer; and
    forming a cap layer over the metal layer.
9. A method comprising:
    forming a boron-containing layer on a substrate;
    oxidizing a portion of the boron-containing layer;
    removing the portion of the boron-containing layer, wherein a remaining portion of the boron-containing layer is disposed over the substrate after the removing of the portion of the boron-containing layer; and
    patterning the remaining portion of the boron-containing layer, wherein the patterned remaining portion is part of a magnetic tunnel junction structure.
10. The method of claim 9, further comprising:
    forming a metal layer directly on the remaining portion of the boron-containing layer; and
    oxidizing the metal layer to form a metal oxide layer.
11. The method of claim 10, further comprising:
    forming a reference layer on the metal oxide layer; and
    forming a cap layer on the reference layer, and
    wherein the patterning of the remaining portion of the boron-containing layer includes patterning the reference layer and the cap layer.
12. The method of claim 9, further comprising:
    forming a seed layer on the substrate;
    forming an Hk enhancing layer on the seed layer; and
    wherein the forming of the boron-containing layer on the substrate includes forming the boron-containing layer on the Hk enhancing layer.

13. The method of claim 9, wherein the removing of the portion of the boron-containing layer includes performing a plasma treatment process.

14. The method of claim 9, further comprising:
- encapsulating the patterned remaining portion of the boron-containing layer in a dielectric layer; and
- after encapsulating the patterned remaining portion of the boron-containing layer, annealing the remaining portion of the boron-containing layer.

15. The method of claim 9, further comprising encapsulating the patterned remaining portion of the boron-containing layer in a dielectric layer, wherein during the encapsulating of the patterned remaining portion of the boron-containing layer an annealing is applied to the patterned remaining portion of the boron-containing layer.

16. A method comprising:
- forming a free layer on a substrate;
- oxidizing a portion of the free layer;
- after the oxidizing of the portion of the free layer, forming a metal layer on the free layer; and
- segregating the oxidized portion from the free layer.

17. The method of claim 16, wherein the segregating of the oxidized portion from the free layer occurs prior to the forming of the metal layer on the free layer, and
- wherein the segregating of the oxidized portion from the free layer includes removing the oxidized portion.

18. The method of claim 16, wherein the segregating of the oxidized portion from the free layer occurs after the forming of the metal layer on the free layer, and
- wherein the segregating of the oxidized portion from the free layer includes the segregated oxidized portion forming an interface with the metal layer.

19. The method of claim 16, further comprising oxidizing the metal layer to form a metal oxide layer after the segregating of the oxidized portion from the free layer.

20. The method of claim 16, wherein the oxidizing of the portion of the free layer includes performing a natural oxidation process on the portion of the free layer.

* * * * *